United States Patent [19]
Bowers et al.

[11] Patent Number: 6,027,354
[45] Date of Patent: Feb. 22, 2000

[54] HIGH TEMPERATURE TEST FIXTURE

[75] Inventors: Kenneth D. Bowers, Escondido; B. Lyle Leigh, Menifee, both of Calif.

[73] Assignee: Micro Instrument Company, Escondido, Calif.

[21] Appl. No.: 09/165,527

[22] Filed: Oct. 2, 1998

[51] Int. Cl.[7] .................................................. H01R 13/02
[52] U.S. Cl. ........................................ 439/225; 324/760
[58] Field of Search ............................ 439/70, 225, 682, 439/684, 683; 324/760

[56] References Cited

U.S. PATENT DOCUMENTS

| | | | |
|---|---|---|---|
| 3,016,512 | 1/1962 | Borchard | 439/225 |
| 3,673,545 | 6/1972 | Rundle | |
| 4,056,299 | 11/1977 | Paige | 439/225 |
| 4,323,842 | 4/1982 | McGarrity et al. | |
| 4,467,275 | 8/1984 | Maeda et al. | |
| 4,508,398 | 4/1985 | Stepan et al. | |
| 4,676,564 | 6/1987 | Mitchell, Jr. | 439/77 |
| 4,788,490 | 11/1988 | Valaas | |
| 5,099,908 | 3/1992 | Taraci et al. | 324/158 F |
| 5,406,217 | 4/1995 | Habu | |

*Primary Examiner*—Steven L. Stephan
*Assistant Examiner*—J. F. Duverne
*Attorney, Agent, or Firm*—Nydegger & Associates

[57] ABSTRACT

An apparatus for connecting an electronic device located in a high temperature environment, with a test unit located in a lower temperature environment, includes a ceramic fixturing plate that is formed with at least one hole. The apparatus also includes a metal spring conductor clip which has a first end and a second end. The first end of the conductor clip is selectively insertable into a hole of the fixturing plate to establish electrical contact with a lead from the electronic device being tested. At the same time, the second end of the conductor clip is engageable with the fixturing plate to hold the conductor clip on the plate. A wire, which is mechanically and electrically connected to the conductor clip, electrically connects the electronic device with the test unit that is located in the lower temperature environment.

16 Claims, 2 Drawing Sheets

HIGH TEMPERATURE TEST FIXTURE

FIELD OF THE INVENTION

The present invention pertains generally to apparatus for testing electronic devices. More specifically, the present invention pertains to electrical connectors which connect the device under test with a test unit. The present invention is particularly, but not exclusively, useful for electrically connecting a device under test that is located in a relatively high temperature environment, with a test unit that is located in a much lower temperature environment.

BACKGROUND OF THE INVENTION

Electronic devices, like other types of products, require testing at various times in their production cycle, under various operational conditions. Typically, such devices require extensive testing for efficacy, suitability, and longevity during research and development. All of this, of course, is accomplished before the products are mass produced for the marketplace. Subsequently, additional random testing of product samples is often required for purposes of quality assurance after full scale production has begun. Thus, throughout the entire life of a product, it is frequently tested in a variety of environments, and challenged in a variety of ways for various functional purposes.

There are, of course, many variables which need to be tested in order to ensure that a final product is suitable for its particular purpose. One very important variable in this regard is temperature. In the particular case of electronic devices such as integrated circuits, it is important to know the exact range of temperatures over which the device is operable. It happens that both extremely high temperatures and extremely low temperatures, can have adverse effects on electronic devices. Many electronic devices, however, are expected to work in very high temperature environments. Accordingly, they are designed to withstand temperatures which may be as high as three hundred and fifty degrees Celsius (350° C.). For reasons stated above, these devices need to be tested under these conditions.

In order to adequately test the operation of an electronic device in an extremely high temperature environment, it is necessary to simulate such an environment. The various test units which may be required to test an electronic device in such an environment may not, however, be able to operate in the environment. A major consideration here stems from the fact that test units are normally designed to operate at lower temperature and test a variety of different types of devices which may, or may not, operate in a lower temperature environment. Thus, the materials which are used in the manufacture of the test equipment can be limiting. For example, common materials used in test units, such as most solders and plastic insulations, are unsuitable and can not be used at extremely high temperatures. A consequence of this is that, although the device under test must be in the high temperature environment, the test unit must be in a different and separate lower temperature environment.

In light of the above, it is an object of the present invention to provide an apparatus for connecting an electronic device with a test unit which is operationally effective for testing the device in extremely high temperature environments, e.g., temperatures as high as three hundred and fifty degrees Celsius (350° C.), while the test unit is located in a much lower temperature environment. Another object of the present invention is to provide an apparatus for connecting an electronic device with a test unit which is adaptable for testing integrated circuits having different dimensions. Yet another object of the present invention is to provide an apparatus for connecting an electronic device with a test unit which is robust and which uses replaceable components. Still another object of the present invention is to provide an apparatus for connecting an electronic device with a test unit which is extremely easy to use, relatively simple to manufacture and comparatively cost effective.

SUMMARY OF THE PREFERRED EMBODIMENTS

An apparatus for connecting an electronic device with a test unit, according to the present invention, includes a ceramic fixturing plate which is formed with a plurality of holes. The device also includes a plurality of metal spring clips which each have a first end and a second end. More specifically, the first end of a clip is insertable into one of the holes in the fixturing plate. As the first end of the spring clip is inserted into the hole, the second end of the spring clip is positioned to engage with the fixturing plate and thereby hold the spring clip on the fixturing plate. An electrical lead from an electronic device, such as an integrated circuit, can then be inserted into the hole to establish an electrical connection between the electronic device and the first end of the spring clip. A wire, which is welded and/or crimped and/or soldered to the spring clip, is connected directly to a test unit. With this arrangement, the electronic device can be electrically connected to the spring clip on the fixturing plate and operated in a high temperature environment (e.g., approximately 350° C.). With its connection to the electronic device through the wire and the clip of the fixturing board, the test unit can then be located in a lower temperature environment.

For the present invention, the fixturing plate is preferably a flat rectangular shaped ceramic structure which has a top surface and a bottom surface and an edge therebetween. In its dimensions, the fixturing plate is approximately one inch (ends of plate) by two inches (sides of plate). Formed through the fixturing plate, between the top surface and the bottom surface, are a plurality of substantially rectangular shaped holes which are arranged on the plate in a matrix of parallel rows and columns. Specifically, the columns of holes are oriented parallel to the sides (length) of the plate. This also orients the columns of holes perpendicular to the ends (width) of the plate. Further, two columns of holes are aligned with one side of the plate while another two columns of holes are aligned with the opposite side of the plate. As intended for the present invention, a plurality of the metal spring clips can be selectively engaged with the rows of holes on either side of the fixturing plate.

Each metal spring clip of the present invention includes a base member and has both a first arm and a second arm which extend from the base member and are substantially parallel to each other. Both arms also extend substantially perpendicular from the base member, and they define a gap between them. Further, the first arm includes a flex arm which is distanced from the base member and which extends at an angle into the gap between first and second arm. Additionally, the second arm has a retainer arm which is distanced from the base member and which is substantially perpendicular to the second arm. The retainer arm, like the flex arm, extends into the gap. The wire is connected to the base member.

As intended for the present invention, the metal spring clip is engaged with the fixturing plate by inserting the flex arm of the clip into a hole of the fixturing plate from the plate's top surface. The base member is then positioned against the edge of the fixturing plate and the retainer arm is then inserted into a hole in the fixturing plate. Depending on the desired configuration of the test fixture apparatus, the flex arm and the retainer arm of the spring clip can be inserted into the same hole or into different holes on the fixturing plate.

In an alternate embodiment of the present invention, the apparatus can include a ceramic retainer plate. For purposes of the present invention, the retainer plate is substantially identical to the fixturing plate in that the materials of manufacture and its overall dimensions are the same as those of the fixturing plate. Further, the retainer plate has the same number and location of through holes as does the fixturing plate. In use, once the spring clips have been engaged with the fixturing plate, the retainer plate is positioned over the fixturing plate and then attached thereto. With this configuration, the spring clips are effectively sandwiched between the fixturing plate and the retainer plate where they are held during the operation of the apparatus. Importantly, the retainer plate holds the spring clips on the fixturing plate as various devices under test are connected, disconnected or reconnected through the apparatus to the test unit.

In the operation of the apparatus for connecting an electronic device with a test unit, an electrically conducting metal spring clip is engaged with the fixturing plate. With this engagement, the clip is held on the fixturing plate and an electrical contact point on the clip is positioned in one of the holes that has been formed through the fixturing plate. An electrical lead from the electronic device that is to be tested is inserted into the same hole of the fixturing plate. Thus, an electrical contact is established between the lead of the electronic device and the clip. This combination, including the device under test, is allowed to operate in an extremely high temperature test environment. Meanwhile, the wire that has been connected to the base of the clip is allowed to extend from the test environment and into another environment (lower temperature) where the test unit is to be located. With the electrical connections disclosed above, the test unit is able to monitor and record the operational parameters of the device under test as it is being operated in the high temperature environment.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION OF THE PREFERRED EMBODIMENT

Figure 1:
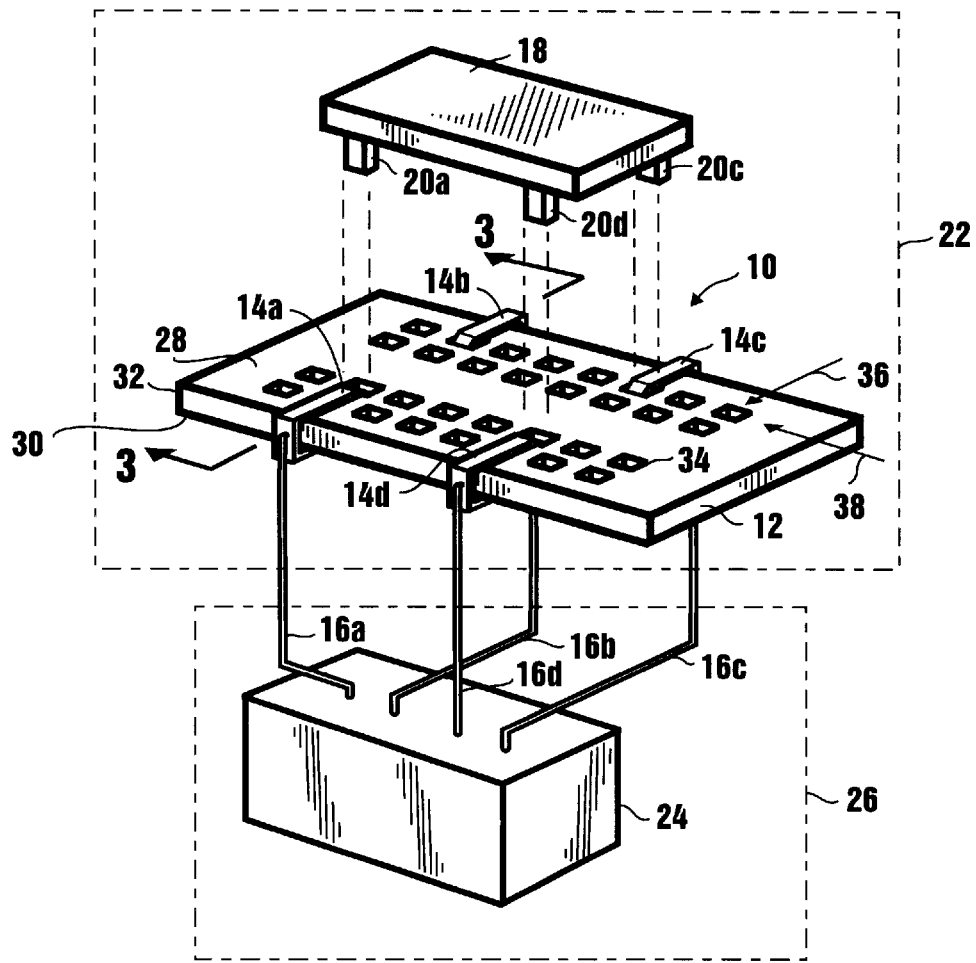
FIG. 1 is an exploded perspective view of the apparatus of the present invention shown positioned for electrically connecting an electronic device with a test unit for the purpose of testing the electronic device.

Referring initially to FIG. 1, an apparatus for connecting an electronic device with a test unit in accordance with the present invention is shown and generally designated 10. As shown, the apparatus 10 includes a dielectric fixturing plate 12, and a plurality of electrical conducting spring clips 14 which are selectively engageable with the plate 12. The particular clips 14a–d shown in FIG. 1 are only exemplary. Indeed, it will be understood by the skilled artisan that as many such clips 14 can be employed for use with the present invention as may be required to establish a proper electrical connection with the device under test. It will also be seen in FIG. 1 that wires 16a–d are respectively connected or attached to the clips 14a–d. Further, and still referring to FIG. 1, it is to be appreciated that leads 20a–d of an electronic device 18 can be electrically engaged with respective clips 14a–d on plate 12. Importantly, the electronic device 18 is engageable with the clips 14 on plate 12 of apparatus 10 in a first environment 22. For purposes of the present invention, this first environment may be an extremely high temperature environment wherein temperatures can be as high as approximately three hundred and fifty degrees Celsius (350° C.). At the same time, via the wires 16, the electronic device 18 is electrically connected to a test unit 24 that can be located in a second environment 26 wherein the temperatures are much cooler and more conducive to the proper operation of the test unit 24.

In detail, the fixturing plate 12 is a generally flat rectangular shaped ceramic structure which has a top surface 28 and a bottom surface 30 with an edge 32 therebetween. Preferably the plate 12 is made of a ceramic such as alumina, but it is to be appreciated that any suitable dielectric material may be used. As best seen in FIG. 1, a plurality of holes 34 are formed through the fixturing plate 12. Specifically, the holes 34 extend between the top surface 28 and the bottom surface 30. Further, the plurality of substantially rectangular shaped holes 34 are arranged on the plate 12 in a matrix of parallel rows (indicated by the arrow 36) and parallel columns (indicated by the arrow 38). Substantially as shown in FIG. 1, the columns 38 of holes 34 are oriented so as to be substantially parallel to the sides of the plate 12. It happens that this also orients them substantially perpendicular to the ends of the plate 12.

Figure 2:
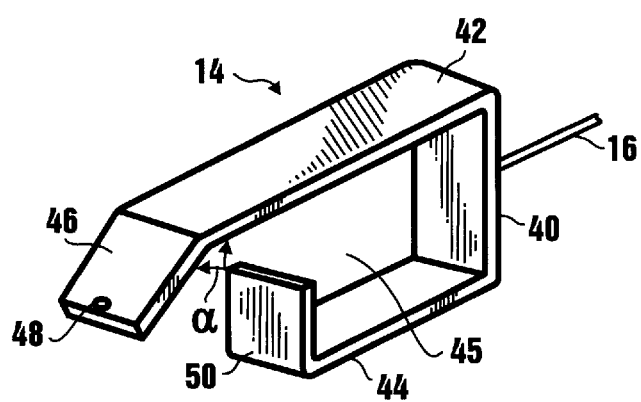
FIG. 2 is a perspective view of a spring clip of the present invention.

The specific structure for the metal spring clips 14 of the present invention are best seen in FIG. 2. There it will be seen that each clip 14 includes a base member 40 and has both a first (upper) arm 42 and a second (lower) arm 44 which each extend outwardly from the base member 40. As the arms 42, 44 extend from the base member 40 they are also substantially perpendicular to the base member 40 and substantially parallel to each other. Thus, the arms 42, 44 establish a gap 45 between them. Further, as shown in FIG. 2, the first (upper) arm 42 includes a flex arm 46 which is distanced from the base member 40 and which extends at an angle a into the gap 45 between first arm 42 and the second arm 44. As also shown in FIG. 2, the second (lower) arm 44 includes a retainer arm 50 which is distanced from the base member 40 and which extends into the gap 45 in a direction that is substantially perpendicular to the second (lower) arm 44. The wire 16, which will be electrically connected with the test unit 24 is integrally connected to the base member 40 by any manner well known in the art, such as welding and/or crimping and/or soldering. Importantly, the connection between wire 16 and base member 40 must be able to withstand the extremely high temperatures of the first environment 22.

As intended for the present invention, the metal spring clip 14 is engaged with the fixturing plate 12 by inserting the flex arm 46 of the clip 14 into a hole 34 of the fixturing plate 12 from the plate's top surface 28. The base member 40 is then positioned against the edge 32 of the fixturing plate 12 and the retainer arm 50 is then inserted into a hole 34 in the fixturing plate 12. Depending on the desired configuration of the test fixture apparatus, the flex arm 46 and the retainer arm 50 of the spring clip 14 can be inserted into the same hole 34 or into different holes 34 on the fixturing plate 12.

Figure 3:
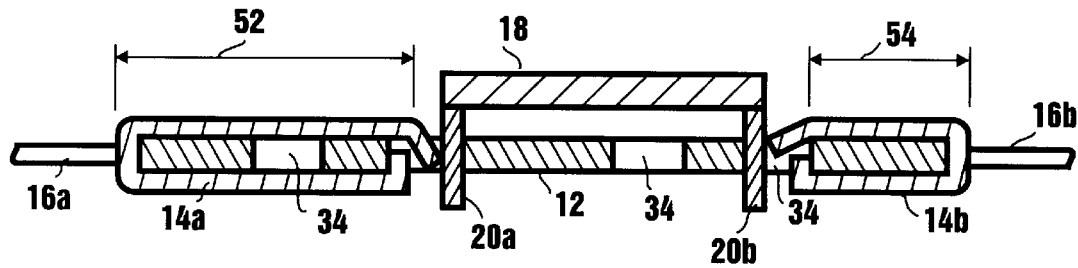
FIG. 3 is a cross sectional view of the apparatus of the present invention when connected with an electronic device, as would be seen along the line 3—3 in FIG. 1.

As best appreciated by cross referencing FIG. 1 with FIG. 3, each of the spring clips 14 can be selectively positioned on the fixturing plate 12. As intended for the present invention, the clips 14 are manufactured in two basic sizes. One size of clip 14 (e.g. clip 14a) establishes a distance 52 between its base member 40 and its flex arm 46. This effectively allows the clip 14a to be mounted on the plate 12 with its flex arm 46 in a hole 34 that is in the second column 38 of holes 34 from the edge 32 of the plate 12. The other size of clip 14 (e.g. clip 14b) establishes a distance 54 between its base member 40 and its flex arm 46. This effectively allows the clip 14b to be mounted on the plate 12 with its flex arm 46 in a hole 34 that is in the first column 38 of holes 34 nearest the edge 32 of the plate 12. As will be appreciated by the skilled artisan, by having variously sized clips 14, it is possible to selectively place clips 14 on the plate 12, as desired. Thus, the plate 12 can be configured to accept a wide variety of electronic devices 18.

Figure 4:
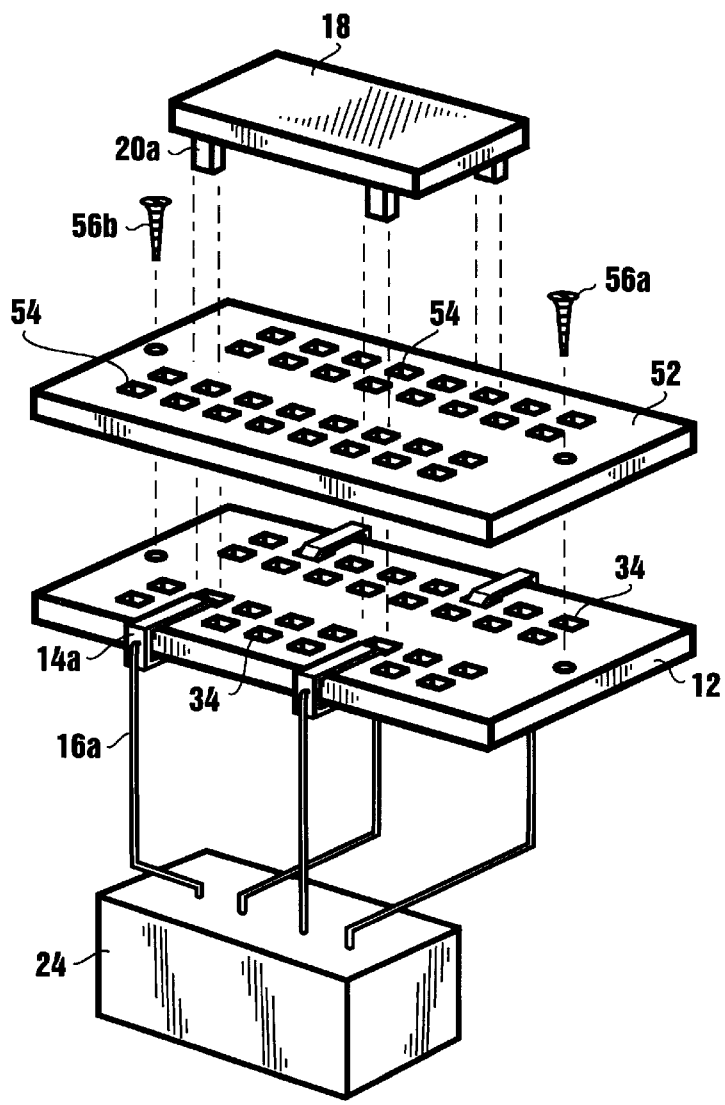
FIG. 4 is an exploded perspective view of an alternate embodiment of the present invention incorporating a retainer plate.

In an alternate embodiment of the present invention, it is shown in FIG. 4 that the apparatus 10 can include a retainer plate 52. In all important respects, the retainer plate 52 is substantially identical with the fixturing plate 12. Specifically, the overall dimensions of the retainer plate 52 are the same as for the fixturing plate 12. Further, the material of manufacture (i.e. a ceramic such as alumina) is the same, and the arrangement and location of holes 54 on the retainer plate 52 are the same as the arrangement and location of holes 34 on the fixturing plate 12. For use of retainer plate 52, once the spring clips 14 have been engaged with the fixturing plate 12, the retainer plate 52 is positioned over the fixturing plate 12 as shown in FIG. 4. The retainer plate 52 is then securely attached to the fixturing plate 12 by any means well known in the art such as by the use of screws 56. Thus, the spring clips 14 are effectively sandwiched between the fixturing plate 12 and the retainer plate 52 and are thereby held on the fixturing plate 12 during the operation of the apparatus 10. Importantly, the retainer plate 52 holds the spring clips 14 on the fixturing plate 12 as various electronic devices 18 are connected, disconnected or reconnected through the apparatus 10 to the test unit 24.

While the particular High Temperature Test Fixture as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. An apparatus for connecting an electronic device with a test unit, said device having a lead extending therefrom and said apparatus comprising:

a fixturing plate formed with at least one hole for receiving said lead therein;

a spring clip having a first end and a second end, said first end being selectively inserted into said hole of said fixturing plate to establish electrical contact with said lead, said second end being engageable with said fixturing plate to hold said spring thereon; and a wire connected to said spring clip to electrically connect said spring clip with said test unit.

2. An apparatus as recited in claim 1 further comprising a retainer plate, said retainer plate being securely attached to said fixturing plate to hold said spring clip on said fixturing plate.

3. An apparatus as recited in claim 2 wherein said fixturing plate and said retainer plate are made of a ceramic material and said ceramic material is alumina.

4. An apparatus as recited in claim 1 wherein said spring clip is made of metal.

5. An apparatus as recited in claim 1 wherein said spring clip comprises:

a base member;

a first arm connected with said base member to extend substantially perpendicular therefrom, said first end being integral with said first arm and distanced thereon from said base member; and a second arm connected with said base member to extend substantially perpendicular therefrom, said second arm being substantially parallel to said first arm to define a gap therebetween, said second end being integral with said second arm and distanced thereon from said base member.

6. An apparatus as recited in claim 5 wherein said first end is a flex arm extending at an angle from said first arm into said gap between said first arm and said second arm.

7. An apparatus as recited in claim 6 wherein said flex arm is formed with an electrical contact point for establishing electrical contact with said lead of said electronic device.

8. An apparatus as recited in claim 5 wherein said second end is a retainer arm, said retainer arm being substantially perpendicular to said second arm and extending therefrom into said gap between said second arm and said first arm.

9. An apparatus as recited in claim 1 wherein said first end of said first arm and said second end of said second arm are inserted into a same said hole in said fixturing plate.

10. An apparatus as recited in claim 1 wherein said fixturing plate is formed with a plurality of said holes, said plurality of holes including a first hole and a second hole, and wherein said first end of said first arm is inserted into said first hole and said second end of said second arm is inserted into said second hole.

11. An apparatus as recited in claim 1 wherein said apparatus is electrically connected to said electronic device in an environment having a temperature above approximately two hundred and fifty degrees Celsius (250° C.), and said apparatus is electrically connected to said test unit in an environment having a temperature substantially below two hundred and fifty degrees Celsius (250° C.).

12. An apparatus for connecting an electronic device with a test unit, said device having a lead extending therefrom and said apparatus comprising:

a dielectric means for supporting said electronic device thereon with said lead exposed in a first environment having a temperature above approximately two hundred and fifty degrees Celsius (250° C.) wherein said dielectric means is a ceramic fixturing plate formed with a plurality of holes, at least one said hole receiving said lead therein; and a conductor means selectively engaged with said dielectric means, said conductor means being in electrical contact with said lead and with said test unit, said test unit being in a second environment having a temperature below approximately two hundred degrees Celsius (200° C.) wherein said conductor means is a spring clip having a first end and a second end, said first end being selectively inserted into one said hole to establish electrical contact with said lead, said second end being engageable with said fixturing plate to hold said conductor means on said dielectric means.

13. An apparatus as recited in claim 12 wherein said spring clip comprises:

a base member;

a first arm connected with said base member to extend substantially perpendicular therefrom, said first end being integral with said first arm and distanced thereon from said base member; and a second arm connected with said base member to extend substantially perpendicular therefrom, said second arm being substantially parallel to said first arm to define a gap therebetween, said second end being integral with said second arm and distanced thereon from said base member.

14. An apparatus as recited in claim 13 wherein said first end is a flex arm extending at an angle from said first arm into said gap between said first arm and said second arm, and wherein said flex arm is formed with an electrical contact point for establishing electrical contact with said lead of said electronic device, and further wherein said second end is a retainer arm, said retainer arm being substantially perpendicular to said second arm and extending therefrom into said gap between said second arm and said first arm.

15. An apparatus as recited in claim 14 wherein said first end of said first arm and said second end of said second arm are inserted into a same said hole in said fixturing plate.

16. An apparatus as recited in claim 14 wherein said fixturing plate is formed with a plurality of said holes, said plurality of holes including a first hole and a second hole, and wherein said first end of said first arm is inserted into said first hole and said second end of said second arm is inserted into said second hole.

\* \* \* \* \*